US012665321B2

(12) United States Patent　　(10) Patent No.:　US 12,665,321 B2
Zhan et al.　　　　　　　　　　(45) Date of Patent:　Jun. 23, 2026

(54) ANTENNA TUNER AND METHODS

(71) Applicant: QUALCOMM INCORPORATED, San Diego, CA (US)

(72) Inventors: Kai Zhan, Escondido, CA (US); Chuan Wang, San Diego, CA (US); Muhammad Hassan, San Diego, CA (US); Bon-Hyun Ku, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 18/897,033

(22) Filed: Sep. 26, 2024

(65) Prior Publication Data

US 2026/0088521 A1　　Mar. 26, 2026

(51) Int. Cl.
H01Q 23/00　　(2006.01)
H03F 3/24　　(2006.01)

(52) U.S. Cl.
CPC ............. H01Q 23/00 (2013.01); H03F 3/245 (2013.01); H03F 2200/451 (2013.01)

(58) Field of Classification Search
CPC ...... H01Q 1/2208; H01Q 3/247; H01Q 3/267; H01Q 3/34; H03G 1/0017; H03G 3/00; H03G 3/004; H03G 3/20; H03G 3/301
See application file for complete search history.

(56) References Cited

U.S. PATENT DOCUMENTS 11,281,247　B2 *　3/2022　Liang ..................... G05F 1/461
2024/0429952　A1 *　12/2024　Hoversten ............ H04B 1/0475

* cited by examiner

*Primary Examiner* — Monica C King
(74) *Attorney, Agent, or Firm* — Smith Tempel Blaha LLC/Qualcomm

(57) ABSTRACT

An antenna tuner receives outputs of detectors coupled to an input and/or an output of each power amplifier (PA) of a plurality of PAs of a multiple antenna system. A processor of the antenna tuner is configured to process the detector outputs and to generate at least one of a gm gate bias value and a cascode gate bias value to be applied to gm and cascode gates, respectively, of a last stage of each of the PAs to change the shape of an input amplitude-to-output amplitude (AM-AM) response of each of the PAs independently of one another. The processor can also be configured to process the detector outputs to generate a varactor bias value to be applied to a terminal of a varactor of each of the PAs to change the shape of an input amplitude-to-output phase shift (AM-PM) response of each of the PAs independently of one another.

20 Claims, 12 Drawing Sheets

1201

RECEIVING AN OUTPUT OF AT LEAST A FIRST DETECTOR COUPLED TO AT LEAST ONE OF AN INPUT AND AN OUTPUT OF A FIRST PA

1202

PROCESSING THE DETECTOR OUTPUT TO PRODUCE AT LEAST ONE OF A gm GATE BIAS VALUE AND A CASCODE GATE BIAS VALUE

1203

APPLYING AT LEAST ONE OF THE gm GATE BIAS VALUE AND THE CASCODE GATE BIAS VALUE TO A gm GATE AND TO A CASCODE GATE, RESPECTIVELY, OF THE FIRST PA

RECEIVING AN OUTPUT OF AT LEAST A FIRST DETECTOR COUPLED TO AT LEAST ONE OF AN INPUT AND AN OUTPUT OF A FIRST PA — 1301

PROCESSING THE DETECTOR OUTPUT TO PRODUCE A VARACTOR BIAS VALUE — 1302

APPLYING THE VARACTOR BIAS VALUE TO A TERMINAL OF THE VARACTOR OF THE FIRST PA — 1303

ANTENNA TUNER AND METHODS

FIELD

The present disclosure relates generally to antenna systems, and more specifically, to an antenna tuner for use in a multiple antenna system.

BACKGROUND

In multiple antenna, phased array systems, each power amplifier (PA) in the system sees a different antenna impedance, resulting in unalignment of the input signal amplitude/output signal amplitude (AM-AM) and of the input signal amplitude/output signal phase shift (AM-PM) of the PAs for the different antennas of the system.

Digital predistortion, or DPD, can be an effective way to improve the linearity and error vector magnitude (EVM) of the PAs of multiple antenna systems. However, current approaches to DPD apply the same predistortion for all of the PAs in the multiple antenna system. Since the PAs see different antenna impedances, applying DPD in the same manner for all of the PAs can be ineffective and possibly have a negative effect for multiple-antenna systems having unaligned AM-AM/AM-PM.

On-chip antenna tuners have been used to independently tune the PAs of multiple antenna systems based on the impedances seen by the PAs from the respective antennas. However, on-chip antenna tuners are typically lossy and bulky.

A need exists for a way to achieve AM-AM and AM-PM alignment that overcomes the shortcomings of current DPD solutions and on-chip tuners.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an antenna tuner for use in tuning a multiple antenna system comprising multiple signal paths having multiple respective PAs coupled to multiple respective antennas. The antenna tuner comprises a memory device and a processor in communication with the memory device. The processor is configured to receive an output of at least a first detector coupled to at least one of an input and an output of a first PA of said multiple PAs. The first PA is located along a first signal path of the multiple signal paths. The processor is further configured to process the output of said at least a first detector to produce at least one of a gm gate bias value and a cascode gate bias value. The processor is further configured to apply at least one of the gm gate bias value and the cascode gate bias value to a gm gate and to a cascode gate, respectively, of a stage of the first PA to change an AM-AM response of the first PA.

Another aspect of the disclosure provides a method for use in tuning a multiple antenna system comprising multiple signal paths having multiple respective PAS coupled to multiple respective antennas. The method comprises, in a processor, receiving an output of at least a first detector coupled to at least one of an input and an output of a first PA of said multiple PAs. The first PA is located along a first signal path of the multiple signal paths. The method further comprises processing the output of said at least a first detector to produce at least one of a gm gate bias value and a cascode gate bias value. The method further comprises applying at least one of the gm gate bias value and the cascode gate bias value to a gm gate and to a cascode gate, respectively, of a stage of the first PA to change an AM-AM response of the first PA.

Another aspect of the disclosure provides a computer program for use in tuning a multiple antenna system comprising multiple signal paths having multiple respective PAs coupled to multiple respective antennas. The computer program is embodied on a non-transitory computer-readable medium and comprises computer instructions for execution by a processor. The computer instructions comprise first, second and third portions. The first portion receives an output of at least a first detector coupled to at least one of an input and an output of a first PA of the multiple PAs. The first PA is located along a first signal path of the multiple signal paths. The second portion processes the output of the first detector to produce at least one of a gm gate bias value and a cascode gate bias value. The third portion applies at least one of the gm gate bias value and the cascode gate bias value to a gm gate and to a cascode gate, respectively, of a stage of the first PA to change an AM-AM response of the first PA.

These and other features and advantages will become apparent from the following description, drawings and claims.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

Figure 1:
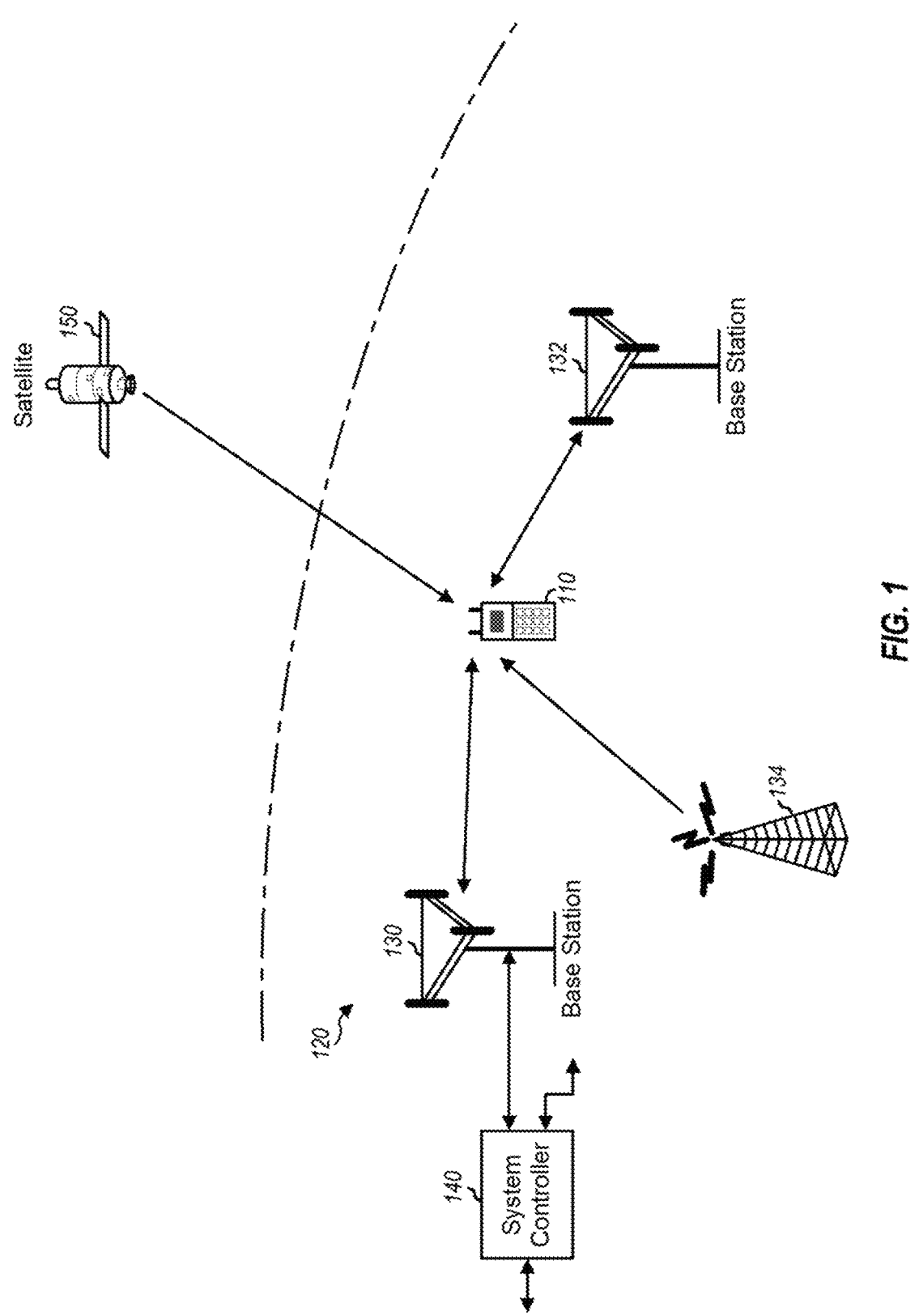
FIG. 1 is a diagram showing a wireless device communicating with a wireless communication system.

In the following detailed description, for purposes of explanation and not limitation, exemplary, or representative, embodiments disclosing specific details are set forth to provide a thorough understanding of an embodiment according to the present teachings. The word "exemplary" is used herein to mean "serving as an example, instance, or illustration." The words "illustrative" or "representative" may be used herein synonymously with "exemplary." Any aspect described herein as "exemplary" is not necessarily to be construed as preferred or advantageous over other aspects. However, it will be apparent to one having ordinary skill in the art and having the benefit of the present disclosure that other embodiments according to the present teachings that depart from the specific details disclosed herein remain within the scope of the appended claims. Moreover, descriptions of well-known apparatuses and methods may be omitted to not obscure the description of the example embodiments. Such methods and apparatuses are clearly within the scope of the present teachings.

As used in the specification and appended claims, the terms "a", "an", and "the" include both singular and plural referents, unless the context clearly dictates otherwise. Thus, for example, "a device" can include one device or plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" or "electrically coupled to" another element, it can be directly connected or coupled, or intervening elements may be present.

The term "memory device", as that term is used herein, is intended to denote a non-transitory computer-readable storage medium that can store computer instructions, or computer code, for execution by one or more processors. References herein to a "memory device" should be interpreted as including one or more memory devices.

A "processor", as that term is used herein encompasses an electronic component that can execute a computer program or executable computer instructions. References herein to a computer comprising "a processor" should be interpreted as one or more processors. The processor may for instance be a multi-core processor comprising multiple processing cores, each of which may comprise multiple processing stages of a processing pipeline. A processor may also refer to a collection of processors within a single system or distributed amongst multiple systems. A "processor", as that term is used herein, can also be implemented solely in hardware, such as one or more state machines or combinational logic.

The term "logic", as that term is used herein, denotes digital circuits, such as digital gate structures, that are combined and configured in a particular manner to achieve one or more functions. For example, control logic can be a combination of digital circuits that have been combined and configured in a particular manner to achieve one or more control functions, either solely in hardware or in a combination of hardware, software and/or firmware.

In accordance with an exemplary embodiment, at least one of the gm gate bias and the cascode gate bias of the last stages of the PAs is adjusted to adjust the AM-AM response of each PA independently based on an indication of the antenna impedance seen by the respective PAs. In most cases, exact antenna impedances cannot be directly measured. In accordance with preferred embodiments of the present disclosure, power detector outputs, together with information from, for example, bench tests and over-the-air (OTA) tests give an indication of the antenna impedances, which is used in accordance with the present disclosure to adjust the gate biases.

The gm and cascode gate biases can both be adjusted to adjust the AM-AM responses of the PAs based on the indication of the antenna impedance seen by the respective PAs. Adjusting the gm gate bias changes the AM-AM response differently from adjusting the cascode gate biases. Combining adjustment of the gm gate bias with adjustment of the cascode gate bias results in a two-dimensional reshaping of the AM-AM response.

In accordance with another exemplary embodiment, in cases in which the stages of the PAs preceding the last stages of the PAs include or are coupled to varactors, the gate biases of the varactors can be adjusted independently of one another based on an indication of the antenna impedance seen by the respective PAs to adjust the AM-PM responses of the PAs. Adjustment of the gate biases of the varactors can be combined with adjustment of the gm and/or cascode gate biases to control and vary the AM-AM and AM-PM responses.

AM-AM alignment means that all of the PAs have approximately the same AM-AM response at a given delivery power. For example, if one of the PAs is delivering 10 decibel-meters (dBm) of output power, then AM-AM alignment occurs if all of the PAs have the same AM-AM response at an output power of 10 dBm regardless of their antenna impedances. AM-PM alignment means that all of the PAs have approximately the same AM-PM response at a given delivery power. The system and method of the present disclosure allow AM-AM and AM-PM alignment to be achieved by independently adjusting the gm gate bias, the cascode gate bias and/or the varactor bias of one or more stages of the PAs independently of one another. As indicated above, current approaches to DPD apply the same predistortion for all of the PAS in the multiple antenna system, but since the PAs see different antenna impedances, applying DPD in the same manner for all of the PAs may not be an effective solution for achieving AM-AM/AM-PM compensation and best EVM. Examples described herein may provide an effective solution for achieving AM-AM/AM-PM alignment and can be employed as a part of DPD or separate from DPD.

Thus, in accordance with these exemplary embodiments, AM-AM/AM-PM alignment and distortion are corrected without indirectly tuning the antenna impedances.

Exemplary embodiments of configurations, operations and attributes of the antenna tuner are described below with reference to FIGS. 3-13. Prior to describing those exemplary embodiments, examples of communications systems in which the antenna tuner may be used will be described with reference to FIGS. 1-2C.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a hand-held device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or may communicate with satellites (e.g., a satellite 150 in one or more global navigation satellite systems (GNSS), or a satellite that can receive signals from the wireless device 110, etc.). Wireless device 110 may support one or more radio technologies for wireless communication such as LTE, WCDMA, CDMA 1x, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
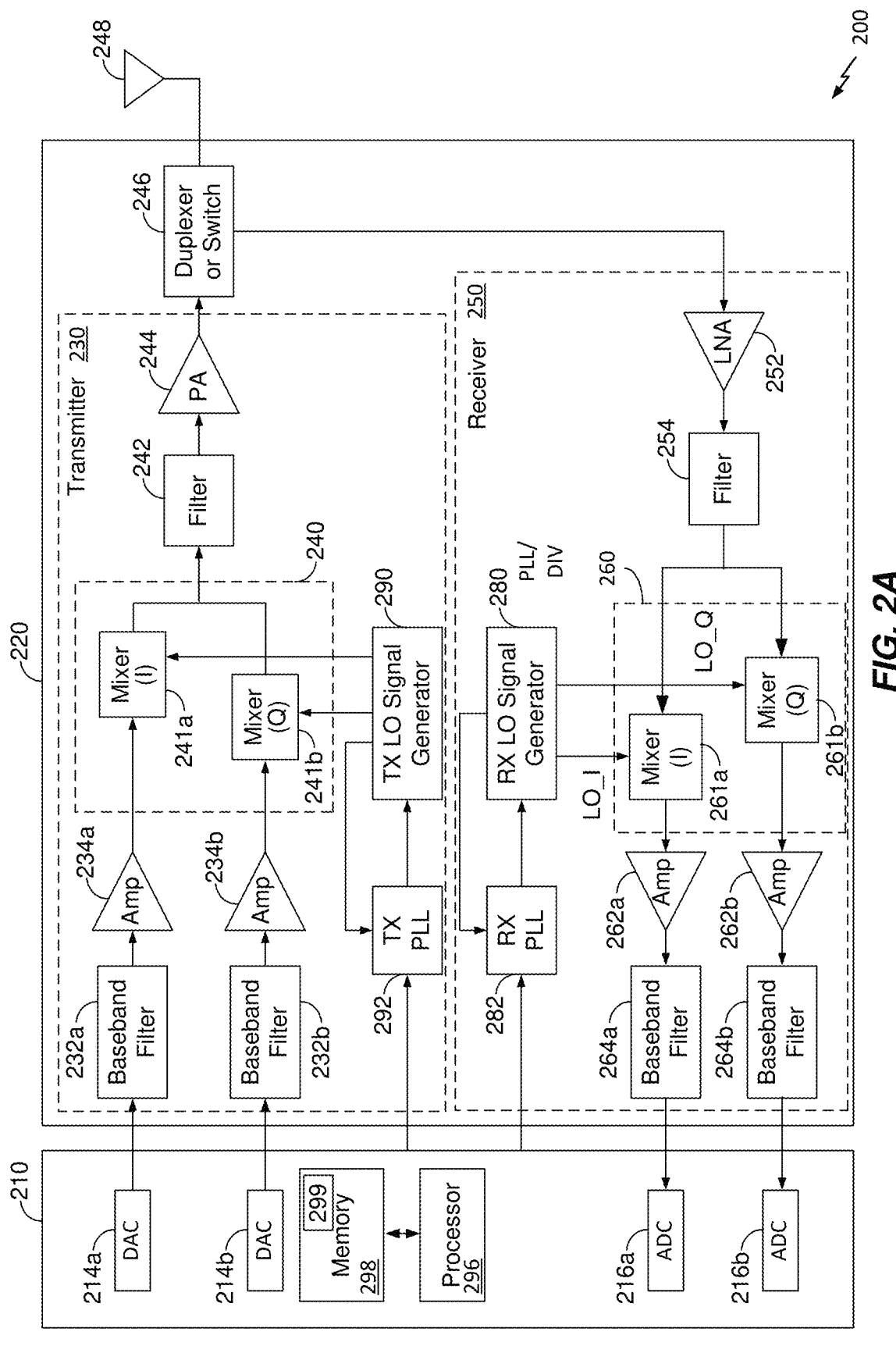
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the pseudo bi-directional amplifier described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal.

Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
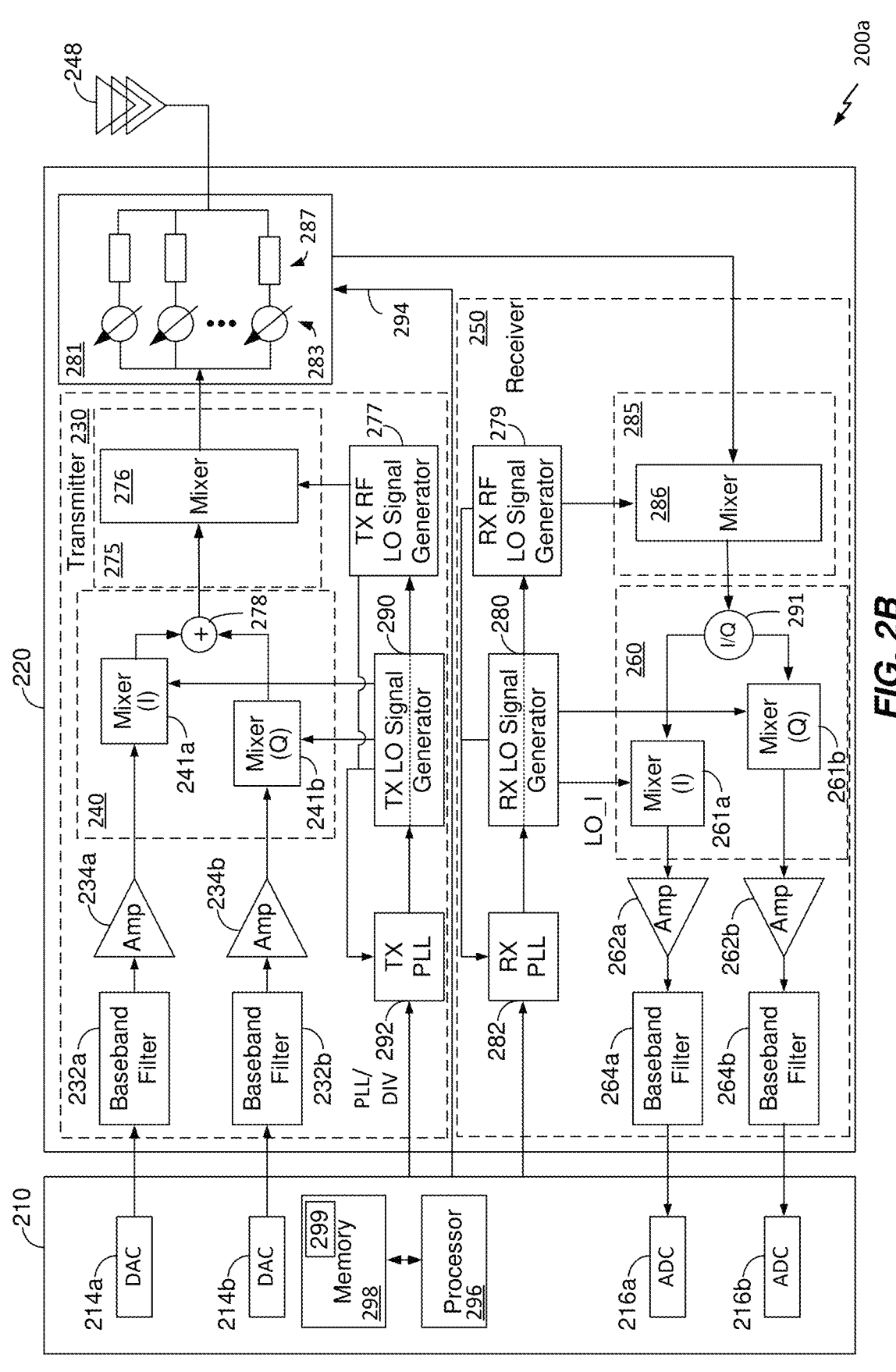
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). The IF signal may be a low IF (LIF) signal, or a zero (or near zero) IF (ZIF) signal. For example, the upconverter 240 may include a summing function 278 and may be configured to provide an IF signal to an upconverter 275. In an exemplary embodiment, the upconverter 275 may comprise upconversion mixer 276. The summing function 278 combines the I and the Q outputs of the upconverter 240 and provides a non-quadrature signal to the upconversion mixer 276. The non-quadrature signal may be single ended or differential. The upconversion mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287. For example, one or two arrays of four or five antennas and corresponding phase shifters/phased array elements may be implemented.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, respective phase shifters 283 may be incorporated within respective phased array elements 287 where each phased array element 287 will include a respective phase shifter 283.

The phase shift circuitry 281 is coupled to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The downconverter 260 includes an I/Q generation function 291. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
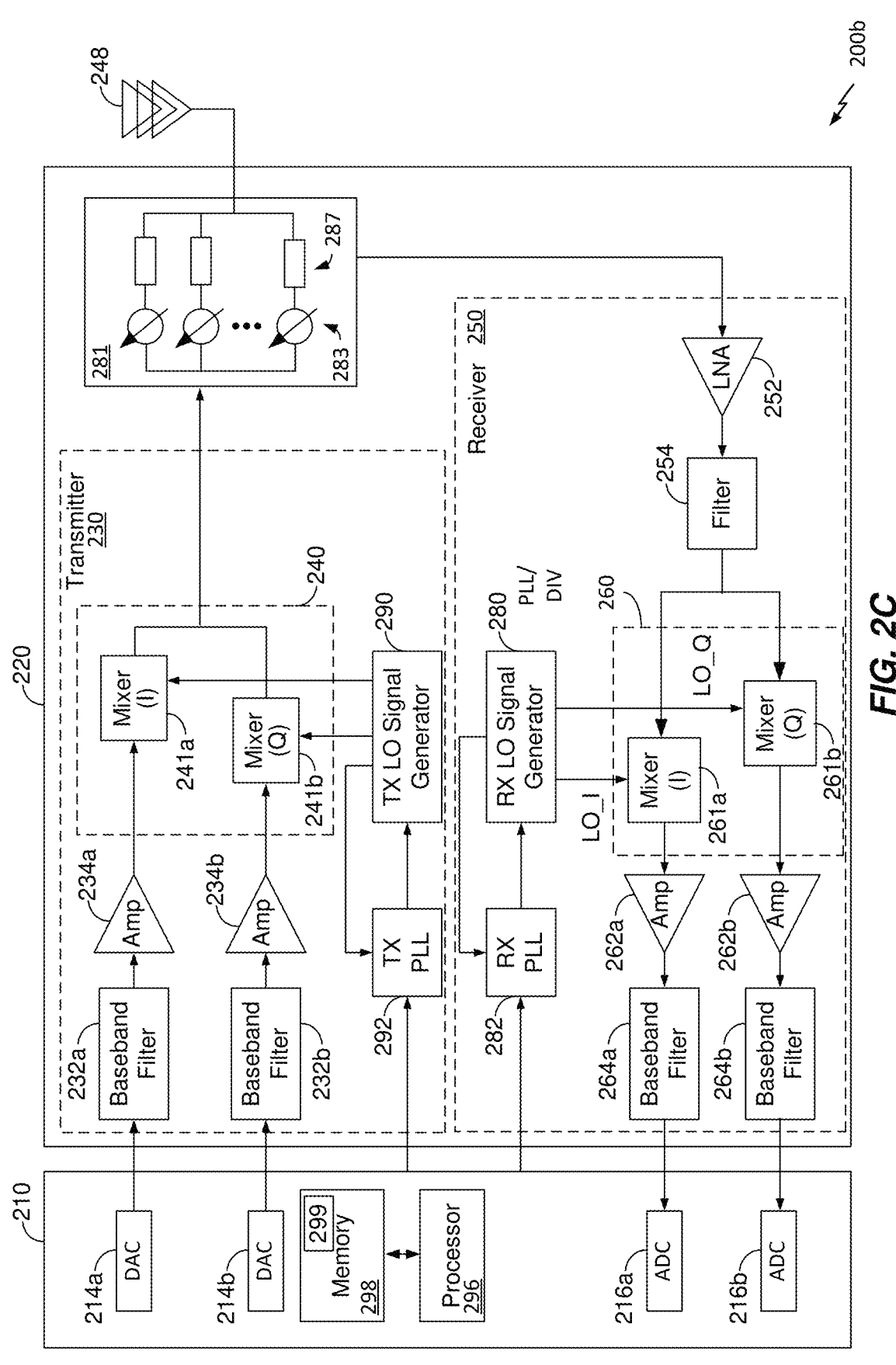
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200b in FIG. 2C may be configured similarly to those in the wireless device 200 shown in FIG. 2A and/or the wireless device 200a shown in FIG. 2B and the description of identically numbered items in FIG. 2C will not be repeated.

The wireless device 200b in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. For example, the LO signals in the architecture of FIG. 2C may comprise signals at frequencies of tens of GHz.

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

Figures 3, 4, 5:
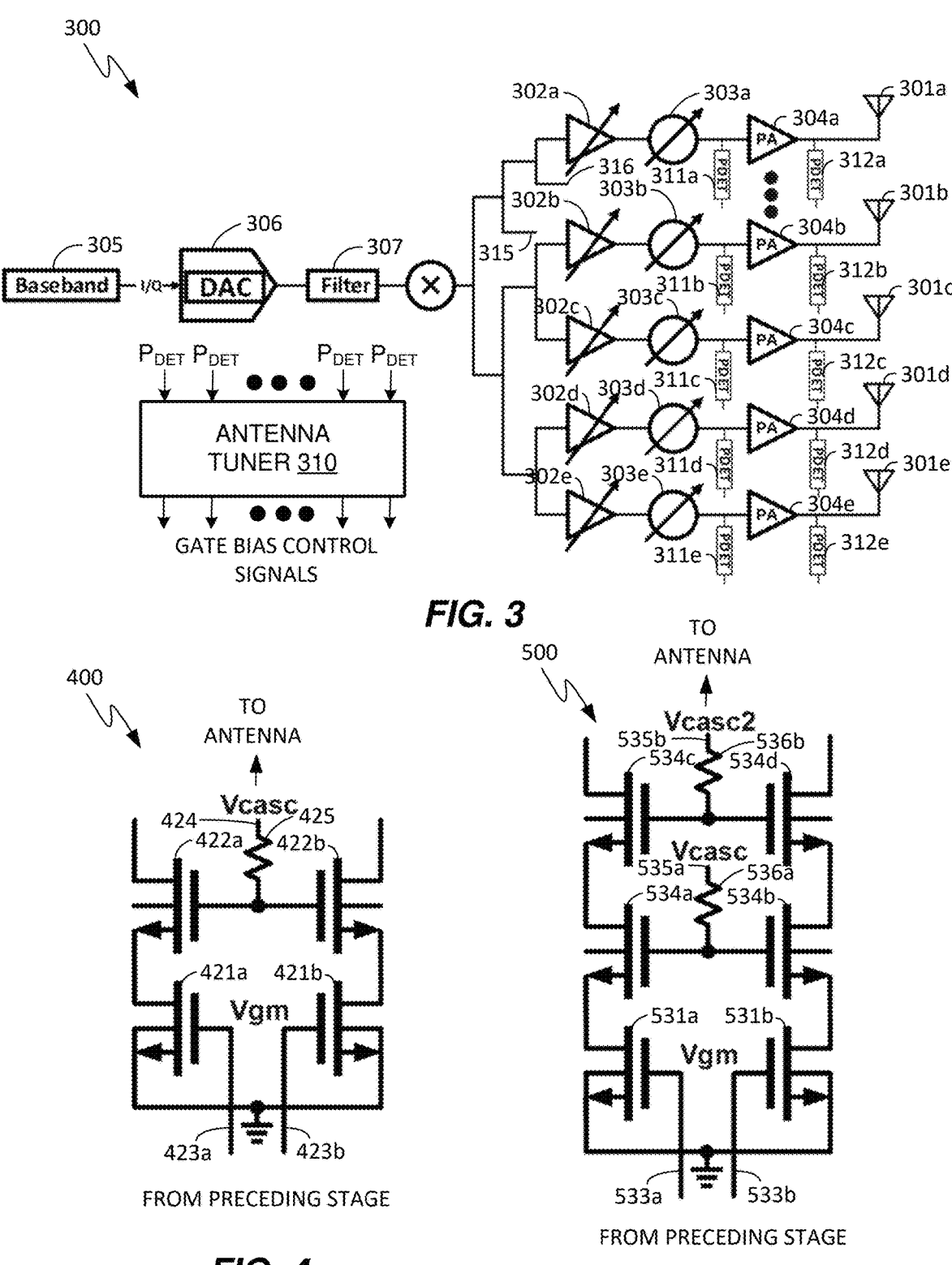
FIG. 3 is a block diagram of a multiple antenna system that includes an antenna tuner in accordance with an exemplary embodiment.
FIG. 4 is a schematic diagram of the last stage of the PAs shown in FIG. 3 for a two-stack PA configuration in accordance with an exemplary embodiment.
FIG. 5 is a schematic diagram of the last stage of the PAs shown in FIG. 3 for a three-stack PA configuration in accordance with an exemplary embodiment.

FIG. 3 shows a block diagram of a multiple antenna system 300 that includes an antenna tuner 310 in accordance with an exemplary embodiment. A general configuration of the multiple antenna system 300 is shown in FIG. 3, but the multiple antenna system 300 can have any suitable configuration, including, but not limited to, the configurations described above with reference to FIGS. 2A-2C and the antenna tuner 310 can be implemented in, for example, the processor 296 shown in FIGS. 2A-2C.

In particular, each antenna 301a-301e is associated with a separate signal processing path. Each signal processing path includes a respective variable gain element 302a-302e, a respective phase shifter 303a-303e and a respective PA 304a-304e, the outputs of which are coupled to the respective antennas 301a-301e. The baseband circuitry 305, the DAC 306 and the filter 307 may be common to all of the signal processing paths. DPD may performed in software in processing circuitry in the baseband circuitry 305, such as in processing circuitry of a modem (not shown), and maybe coupled to baseband hardware shared by the signal processing paths. The antenna tuner 310 similarly may be implemented in software in the baseband circuitry 305 (e.g., in the modem and/or in a separate processor), or may be implemented in hardware, software and/or firmware at any suitable location.

In accordance with this exemplary embodiment, in each of the signal processing paths, first power detectors, $P_{DETs}$, 311a-311e are coupled to the input terminals of the respective PAs 304a-304e and second power detectors 312a-312e are coupled to the output terminals of the respective PAs 304a-304c. The $P_{DETs}$ 311a-311e measure the amplitudes of the input signals received at the input terminals of the PAs 304a-304c and the $P_{DETs}$ 312a-312e measure the amplitudes of the output signals outputted from the output terminals of the PAs 304a-304c. The output signals generated by the $P_{DETs}$ 311a-311e and 312a-312e are input to the antenna tuner 310. The antenna tuner 310 is configured to process the outputs of the $P_{DETs}$ 311a-311e and 312a-312e to produce control signals that control one or more of the gm gate biases, the cascode gate biases and the varactor biases of the PAs 304a-304c independently of one another.

It should be noted that the $P_{DETs}$ can be disposed at various locations in the signal processing paths. It is not necessary for there to be $P_{DETs}$ at both the input terminals and output terminals of the PAs 304a-304c. The $P_{DETs}$ are used to measure signal swing at various locations along the signal processing paths and preferably are disposed at least at the output terminals of the PAs 304a-304c. However, they can be located at other locations along the signal processing paths. The unterminated signal paths 315 and 316 and the ellipsis in between the PAs 304a and 304b are used in FIG. 3 to indicate that there could be additional signal processing paths that are not shown in FIG. 3. Therefore, while five signal processing paths are depicted in FIG. 3, the multiple antenna system 300 may have any number of signal processing paths.

In accordance with an exemplary embodiment, the antenna tuner 310 uses a lookup table (LUT) that can be in the memory device 298 shown in FIGS. 2A-2C or in some other memory that is within or is accessible by the antenna tuner 310. The LUT stores the gm and cascode gate bias values and may also store the varactor bias values for scenarios in which the PAs 304a-304c include varactors. The signals that are output from the $P_{DETs}$ 311a-311c and 312a-312e may be converted into digital values by an ADC that is internal to or external to the antenna tuner 310. These digital values are then processed by processing logic of the antenna tuner 310 into index values that are then used to index the LUT. The antenna tuner 310 then applies the values to the gm, cascode and/or varactor gates to perform AM-AM/AM-PM alignment. An alternative to using the $P_{DETs}$ for this purpose is to use bench tests such as loadpull tests or over-the-air (OTA) tests in the factory to measure the signal swing along the processing paths and then use the measurements to index the LUT to obtain the gate bias values to be applied to the PAs 304a-304d. In other examples, circuitry is used to determine appropriate bias values from analog signals, or digital signals are input to a trained model and a processor or other artificial intelligence means determines values for the gm gate bias, the cascode gate bias, and/or the varactor bias.

FIGS. 4 and 5 show schematic diagrams of examples of the last stage of the PAs 304a-304c shown in FIG. 3 for a two-stack PA configuration and a three-stack PA configuration, respectively. The two-stack PA configuration 400 shown in FIG. 4 comprises two n-type Metal Oxide Semiconductor Field Effect Transistors (NMOS FETs) 421a and 421b that receive the gm gate bias signals at terminals 423a and 423b, respectively, and two cascode NMOS FETs 422a and 422b that receive the cascode gate bias signal at terminal 424 across a resistor 425. Terminals 423a and 423b may also be connected to an output of a preceding stage of the PA. The three-stack PA configuration 500 shown in FIG. 5 comprises two NMOS FETs 531a and 531b that receive the gm gate bias signals at terminals 533a and 533b, respectively, and two pairs of cascode NMOS FETs 534a, 534b and 534c, 534d that receive the cascode gate bias signals at terminals 535a and 535b across resistors 536a and 536b, respectively. Terminals 533a and 533b may also be connected to an output of a preceding stage of the PA. In response to measurements made by the $P_{DETs}$ 311a-311e and 312a-312e, the antenna tuner 310 generates the gate bias values and causes them to be applied to terminals 423a, 423b, 424, 533a, 533b, 535a and 535b to cause the AM-AM response to be controlled or varied in a particular manner.

Figure 6:
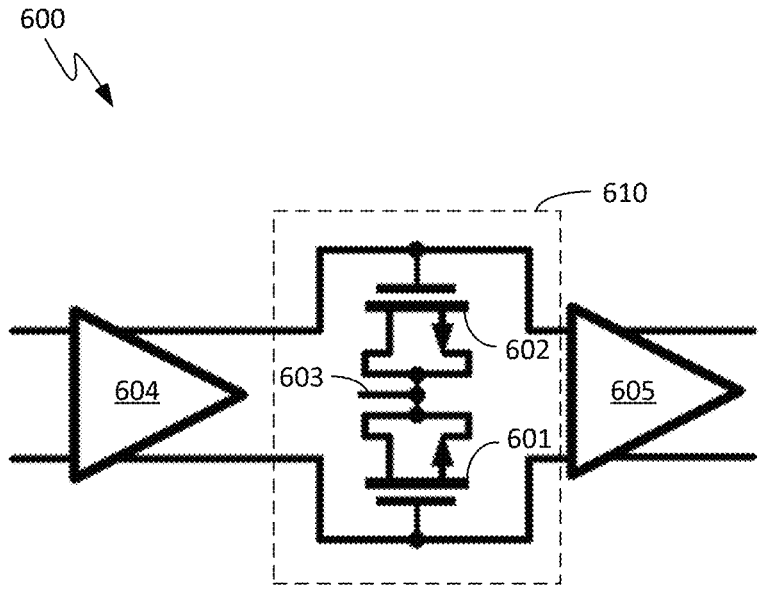
FIG. 6 is a schematic diagram of a PA corresponding to one of the PAs shown in FIG. 3 in accordance with an exemplary embodiment in which the stage in between a last stage and a preceding stage of the PA comprises a varactor.

FIG. 6 shows a schematic diagram of a PA 600 corresponding to one of the PAS 304a-304c shown in FIG. 3 in accordance with an exemplary embodiment in which the stage in between a preceding stage 604 and the last stage 605 of the PA 600 comprises a varactor 610. The varactor 610 comprises first and second NMOS FETs 601 and 602 that are configured and interconnected to act as a variable capacitor having a capacitance that varies based on the varactor bias applied to terminal 603. The amplifier stage 605 may be the last stage of the PA before the antenna and can have the configurations 400 or 500, for example, shown in FIGS. 4 and 5, respectively, although other amplifier configurations are possible as well. In response to measurements obtained by the $P_{DETs}$ 311a-311e and 312a-312e, the antenna tuner 310 generates the varactor bias values and causes them to be applied to terminal 603 to cause the AM-PM response to be controlled or varied in a particular manner. The varactor bias is applied via terminal 603 to the sources and drains of the NMOS FETs 601 and 602.

Figure 7:
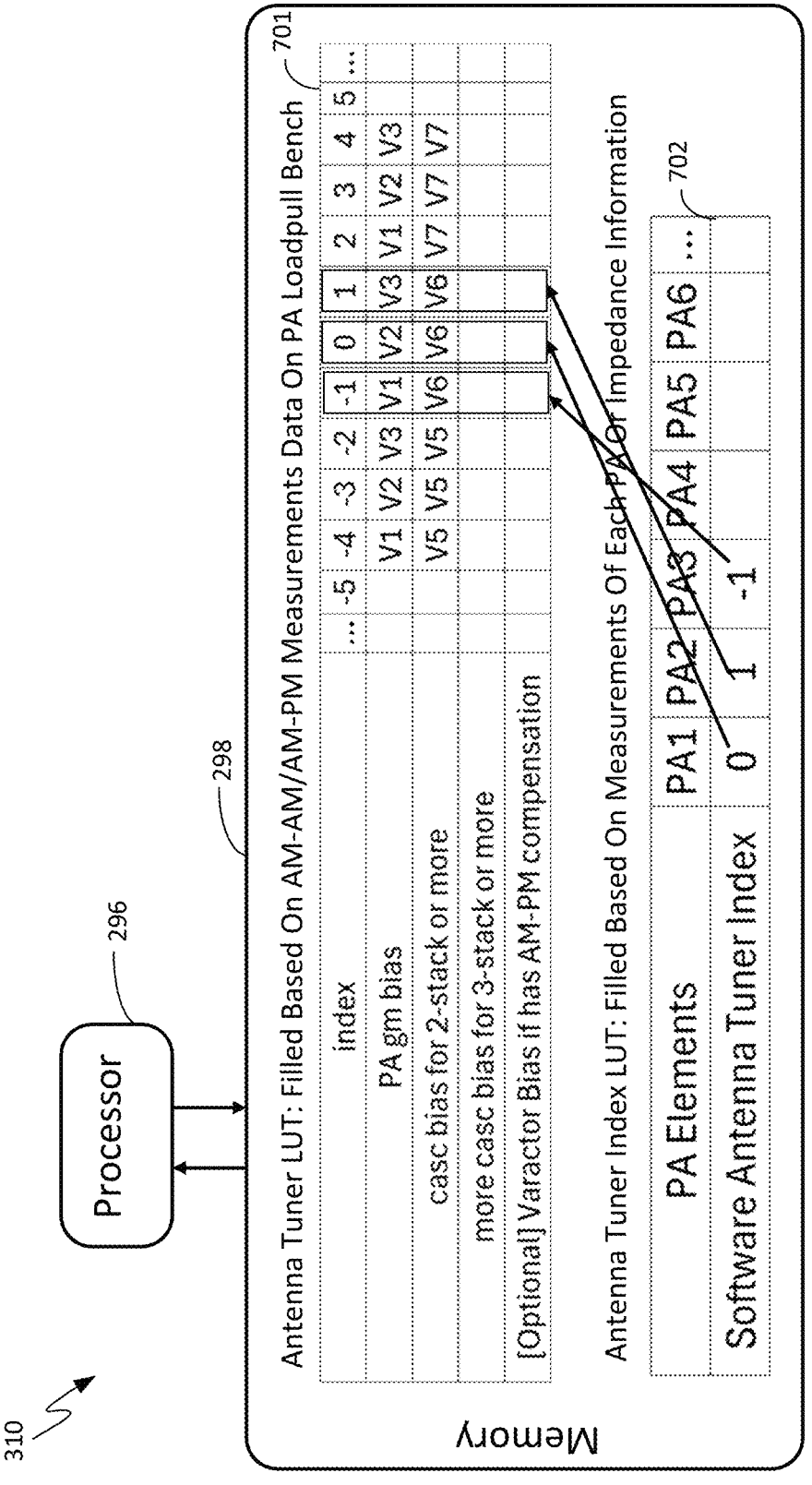
FIG. 7 is a block diagram of the antenna tuner shown in FIG. 3 in accordance with an exemplary embodiment in which the tuner comprises the processor 296 and the memory device 298 shown in FIGS. 2A-2C.

FIG. 7 shows a block diagram of an example of the antenna tuner 310 shown in FIG. 3 in accordance with an exemplary embodiment in which the tuner 310 comprises the processor 296 and the memory device 298 shown in FIGS. 2A-2C, where the memory device 298 comprises a LUT 701 that maps index values to gm gate bias values, cascode gate bias values and varactor bias values based on the PA configuration and a LUT 702 that maps the different PAs 304a-304e to the different index values. For the example shown in FIG. 7, the LUT 701 is designed to be used with different PA configurations, including a two-stack last stage, a three-stack last stage and the varactor stage preceding the last stage as shown in FIGS. 4, 5 and 6, respectively. However, for case of discussion, only gm and cascode gate bias values are shown.

The gm and cascode gate bias values are represented in FIG. 7 by V1-V3 and V5-V7. The gate bias values contained in the LUT 701 can be determined by taking measurements during a load-pull bench test during which the different impedance loads are placed on the outputs of the PAs 304a-304c and the AM-AM/AM-PM responses are observed for the different impedance loads independently for each of the PAs 304a-304c. The LUT 702 maps each of the PAs 304a-304e to a respective column in the LUT 701 containing the gate values to be applied to the terminals of the corresponding stage of the respective PA. In the example shown in FIG. 7, PA 304a maps to index 0, PA 304b maps to index 1 and PA 304c maps to index −1. During the tuning process performed by the tuner 310, the processor 296 maps the PAs 304a-304c to their corresponding indices in LUT 702, and then maps the corresponding indices to the gate bias values contained in the corresponding columns of LUT 701. These gate bias values are then applied to the corresponding terminals of the corresponding stages of the PAs 304a-304c.

Portions of the multiple antenna system 300 shown in FIG. 3 may be contained in a radio frequency (RF) integrated circuit (IC) chip. For example, components 302a-312e may be contained in an RFIC chip. The antenna tuner 310 may be external to the RFIC chip and interconnected with the RFIC chip via an interface. For example, the antenna tuner 310 may be part of a modem. The gate bias values and indices used in the LUTs 701 and 702 can be preselected and set in the factory prior to shipment of the product that contains the multiple antenna system 300. For example, load-pull bench testing can be performed to measure the AM-AM and/or AM-PM responses of the PAs 304a-304e at different antenna impedance values while adjusting the gate bias values to determine the proper gates bias values to be used to achieve AM-AM/AM-PM alignment. In this way, the gates bias values and the indices of the LUTs 701 and 702, respectively, are generated and stored in the LUTs 701 and 702.

The indices used in the LUT 702 can be determined in the field (i.e., once the product has been incorporated into a module or housing) such that the indices are chosen to compensate AM-AM/AM-PM responses for housing and/or module effects. For example, the P_DETs 312a-312e can be embedded within the RFIC chip to allow measurements to be taken after the RFIC has been placed in a module or housing, in which case the LUT 702 is configured by the processor 296 in the field. The LUT 702 can be configured a single time by the processor 296 in the field, or the processor 296 can be programmed to reconfigure the LUT 702 at runtime or at startup of the RFIC based on measurements obtained by the P_DETs 312a-312e at startup or runtime. In other examples, the processor 296 may periodically use measurements from the P_DETs 312a-312e to determine values for the gm and/or cascode gate biases (and, e.g., configure the LUT 702). Such periodic measurement and programming may be performed according to a schedule, when values (e.g., temperature, gain) change by a threshold amount, etc.

Figure 8:
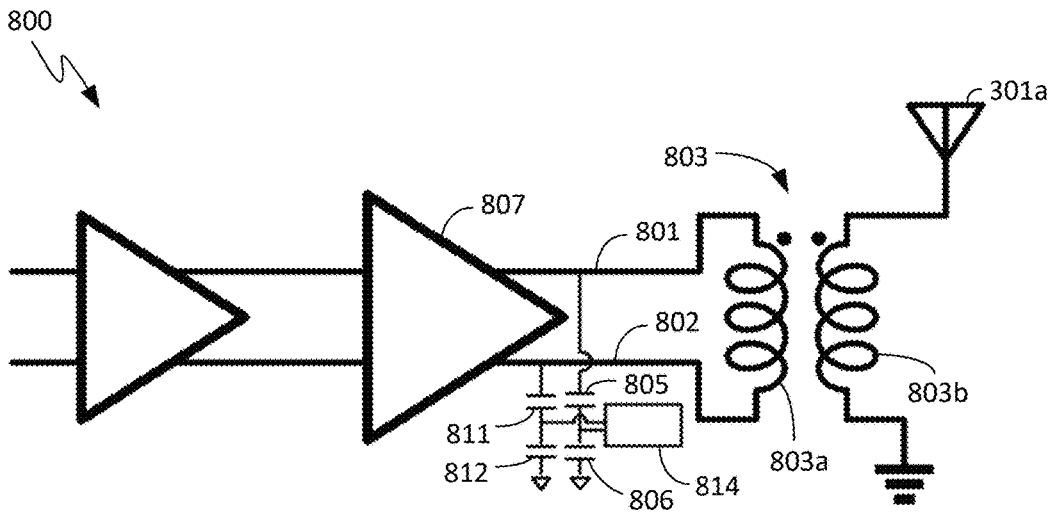
FIG. 8 is a block diagram of one of the signal paths of one of the PAs shown in FIG. 3 in accordance with an exemplary embodiment.

FIG. 8 shows a block diagram of an example of one of the signal paths 800 of one of the PAs 304a-304c shown in FIG. 3 in accordance with an exemplary embodiment in which the output terminals of the last stage 807 of the PA are coupled to a capacitor divider circuit that is coupled to a detector 814 that detects AM-AM responses in the field. For example purposes, it will be assumed that the last stage 807 is the last stage of the PA 304a shown in FIG. 3, that the last stage 807 has one of the configurations shown in FIGS. 4 and 5 and that the antenna shown in FIG. 8 is antenna 301a shown in FIG. 3. First and second output terminals 801 and 802 of the PA 304a are coupled to a transformer 803 comprising primary and secondary side inductors 803a and 803b, respectively, that inductively couple the output of the PA 304a to the antenna 301a. The transformer 803 is sometimes considered to be the last stage of the PA. While the AM-AM response detector 814 is shown located on the primary side 803a, it can instead be located on the secondary side 803b. Further, while a differential output from the PA 304 is illustrated, it will be understood that the PA 304a may be configured with a single-ended output. In addition, the inductors 803a and 803b are optional.

In accordance with this exemplary embodiment, the in-the-field detection of AM-AM responses by the detector 814 is used to configure the LUT 702 in the field to compensate for AM-AM/AM-PM distortion resulting from housing or module effects. One of the output terminals 801 of the PA 304a is coupled to a first terminal of a first capacitor 805 of a capacitor divider circuit. A second terminal of the first capacitor 805 is coupled to a first terminal of a second capacitor 806 of the capacitor divider circuit, the second terminal of which is coupled to ground. The other output terminal 802 of the PA 304a is coupled to a first terminal of a third capacitor 811 of the capacitor divider circuit. A second terminal of the third capacitor 811 is coupled to a first terminal of a fourth capacitor 812 of the capacitor divider circuit, the second terminal of which is coupled to ground. A first terminal of the detector 814 is coupled to the second terminal of the first capacitor 805 and to the first terminal of the second capacitor 806. A second terminal of the detector 814 is coupled to the second terminal of the third capacitor 811 and to the first terminal of the fourth capacitor 812. The capacitors 805, 806, 811 and 812 have small capacitance values so that they do not create much of a load on the output of stage 807. It should be noted that very little additional space is consumed by the capacitor divider circuits and the detectors 814. Also, in some cases RFICs already have embedded detectors that can be used for this purpose.

To perform the in-the-field measurements, the input of the PA 304a is driven with a signal having a first preselected power level and the voltage swing at output terminals 801 and 802 is measured by the detector 814. The input of the PA 304a is then driven with a signal having a second preselected power level (e.g., a power level less than the first power level) and the voltage swing at output terminals 801 and 802 is measured by the detector 814. The two voltage swings are then compared with one another by processor 296 to calculate the AM-AM response for the PA 304a coupled to the antenna 301a. This process is performed for each of the PAs 304a-304e and the PA-to-index value mapping of the LUT 702 is configured during this process.

To obtain the values for the LUT 701, many measurements of the AM-AM/AM-PM responses of each of the PAs 304a-304e may be performed, for example on a loadpull bench, while sweeping the PA biases and varying the (loadpull) impedances. Based on the measurement data, the particular combination of bias values to be applied to the PA to cause it to exhibit a particular behavior are determined. Each particular combination of bias values is then stored in an index value column of the LUT 701.

For example, default values can be inserted into the 0 index value column of LUT 701. The 1 index value column of the LUT 701 can be filled with bias values that will cause the PA to exhibit a +x dB gain expansion. The 2 index value column of the LUT 701 can then be filled with bias values that will cause the PA to exhibit a +2x dB gain expansion. The −1 index value column of the LUT 701 can be filled with bias values that will cause the PA to exhibit an x dB gain compression. The −2 index value column of the LUT 701 can be filled with bias values that will cause the PA to exhibit a 2x dB gain compression. The output power levels detected by the detector 814 can be measured twice for two different input power levels to the PA 807. For example, assuming that an input power level to the PA 807 of x_1 dBm results in a measured output power level of y_1 dBm and that increasing the input power level from x_1 dBm to x_2 dBm=x_1+dx dBm results in an output power level of y_2 dBm, where $y_2-y_1=dx$, this means that the PA 807 is aligned, in which case the corresponding values in the LUT 701 will be used during operations. If, for example, those values are contained in the 0 index value column of LUT 701, the 0 index value will be stored in the index value LUT 702 for that particular PA.

If $y_2-y>dx$, this means the PA is exhibiting gain expansion, and depending on how much gain expansion is deemed acceptable, the system may decide to use different bias values from a different index value column of the LUT 701. Assuming that a decision is made that the particular PA will be using the bias values from, for example, the 2 index value column of the LUT 701, the 2 index value will be stored in the LUT 702 for that particular PA. If $y_2-y_1<dx$, this means that the PA is exhibiting gain compression, and depending on how much gain compression is deemed acceptable, the system will decide whether to use different bias values from a different index value column of the LUT 701. For whichever values are chosen from the index value column of the LUT 701, the corresponding index value for that column will be stored in the LUT 702 for that particular PA.

Figure 9:
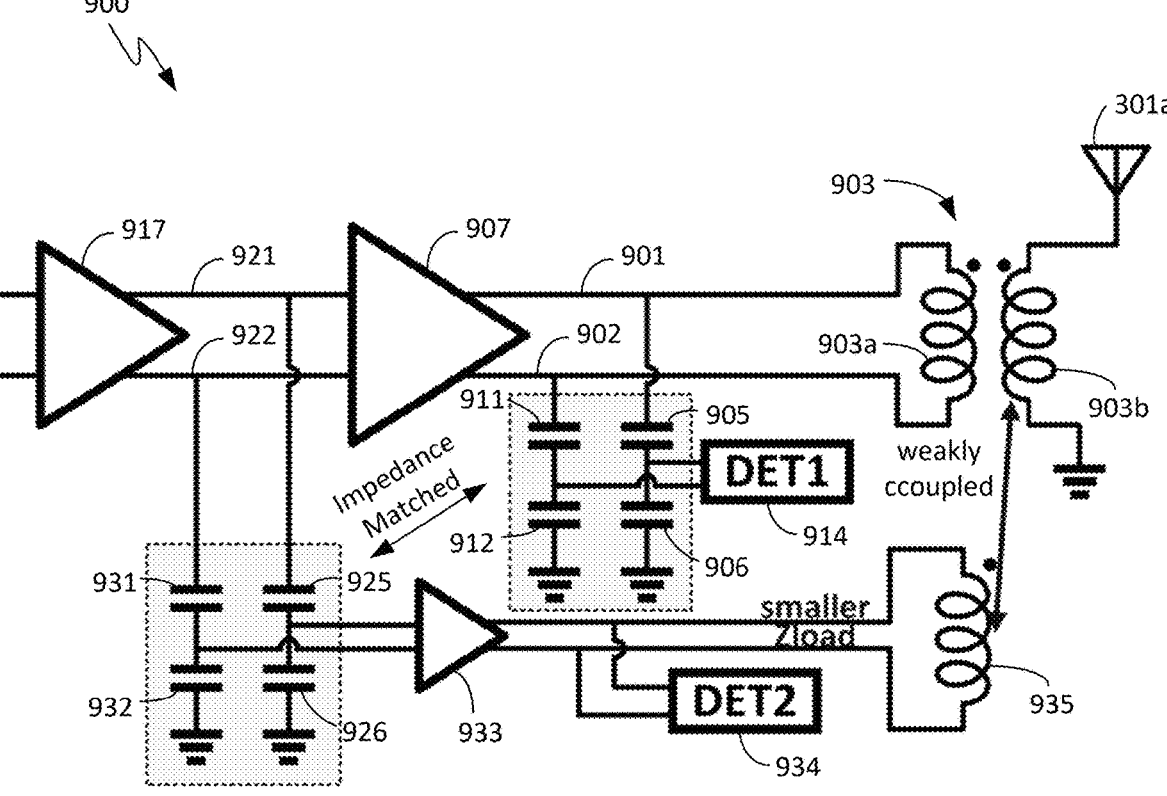
FIG. 9 shows a block diagram of one of the signal paths of one of the PAs shown in FIG. 3 in accordance with an exemplary embodiment.

FIG. 9 shows a block diagram of one of the signal processing paths 900 of one of the PAs 304a-304c shown in FIG. 3 in accordance with an exemplary embodiment. In accordance with this exemplary embodiment, the output terminals of the last stage 907 of the PA are coupled to a first capacitor divider circuit that is coupled to a first detector 914 and the output terminals of a preceding stage of the PA are coupled to a second capacitor divider circuit that is coupled to the input of a small amplifier 933, the output of which is coupled to a second detector 934. The detectors 914 and 934 are used to detect AM-AM responses on the fly during runtime operations.

The first and second output terminals 901 and 902 of stage 907 are coupled to a transformer 903 comprising primary and secondary side inductors 903a and 903b, respectively, that inductively couple the output of stage 907 to the antenna 301a. Stage 907 can have one of the configurations shown in FIGS. 4 and 5, for example. One of the output terminals 901 is coupled to a first terminal of a first capacitor 905 of the first capacitor divider circuit. A second terminal of the first capacitor 905 is coupled to a first terminal of a second capacitor 906 of the first capacitor divider circuit, the second terminal of which is coupled to ground. The other output terminal 902 of stage 907 is coupled to a first terminal of a third capacitor 911 of the first capacitor divider circuit. A second terminal of the third capacitor 911 is coupled to a first terminal of a fourth capacitor 912 of the capacitor divider circuit, the second terminal of which is coupled to ground.

A first terminal of the detector 914 is coupled to the second terminal of the first capacitor 905 and to the first terminal of the second capacitor 906. A second terminal of the detector 914 is coupled to the second terminal of the third capacitor 911 and to the first terminal of the fourth capacitor 912. The capacitors 905, 906, 911 and 912 have small capacitance values so that they do not create much of a load on the output of stage 907.

The first and second output terminals 921 and 922 of the preceding stage 917 are coupled to a second capacitor divider circuit of a dummy signal path. The first and second capacitor divider circuits have matched impedances. The stage 917 does not have to be the stage immediately preceding the last stage 907, but can be any earlier stage in the signal path that has no, or at least very little, AM-AM distortion because the signal amplitude is small at this point in the signal processing path The output terminal 921 is coupled to a first terminal of a first capacitor 925 of the second capacitor divider circuit. A second terminal of the first capacitor 925 of the second capacitor divider circuit is coupled to a first terminal of a second capacitor 926 of the second capacitor divider circuit, the second terminal of which is coupled to ground. The output terminal 922 of stage 917 is coupled to a first terminal of a third capacitor 931 of the second capacitor divider circuit. A second terminal of the third capacitor 931 of the second capacitor divider circuit is coupled to a first terminal of a fourth capacitor 932 of the second capacitor divider circuit, the second terminal of which is coupled to ground. The capacitors 925, 926, 931 and 932 have small capacitance values so that they do not create much of an impedance load.

A first terminal of the small dummy amplifier stage 933 is coupled to the second terminal of the first capacitor 925 of the second capacitor divider circuit and to the first terminal of the second capacitor 926 of the second capacitor divider circuit. A second terminal of the small dummy amplifier stage 933 is coupled to the second terminal of the third capacitor 931 of the second capacitor divider circuit and to the first terminal of the fourth capacitor 932 of the second capacitor divider circuit.

A first terminal of the second detector 934 is coupled to a first output terminal of the dummy amplifier stage 933. A second terminal of the second detector 934 is coupled to the second output terminal of the dummy amplifier stage 933. The first and second output terminals of the dummy amplifier stage 933 are also coupled to first and second terminals, respectively, of an inductor 935 having a small inductance value such that it only weakly inductively couples with the inductor 903b, and therefore has very low impedance.

The dummy amplifier stage 933 is a small copy of amplifier stage 907 that has much better linearity than amplifier stage 907 due it having a smaller load impedance. The gain of amplifier stage 933 tracks the linear gain of amplifier 907 such that the value measured by the second detector 934 acts as a reference value for on-the-fly AM-AM detection.

Before performing on-the-fly gate bias adjustments, a calibration process is performed during which the input of stage 917 is driven with an input signal having a preselected power level and the voltage swings at output terminals 921, 922 of stage 917 and at the output terminals 901, 902 of stage 907 are measured by the detectors 914 and 934, respectively. As indicated above, stage 917 produces an AM-AM response with no distortion whereas the last stage 907 will produce an AM-AM response with distortion caused by the impedance of antenna 301a and other factors, such as the transistors of the PAs 304a-304e operating in nonlinear regions. The processor 296 of the antenna tuner 310 compares these AM-AM responses for multiple different preselected power levels of the input signal to stage 917 and determines the gate bias values for the gates of stage 907 that are needed to align the AM-AM response of stage 907 with the AM-AM response of stage 917.

This calibration process is performed for each of the PAs 304a-304. The processor 296 stores the corresponding mapping of the PAs 304a-304e to the indices in LUT 702. During operations of the multiple antenna system 300, the processor 296 uses the PA-to-index mapping contained in LUT 702 to obtain the gate bias values stored in LUT 701 and applies them to the gates of the respective stages 907.

Figure 10:
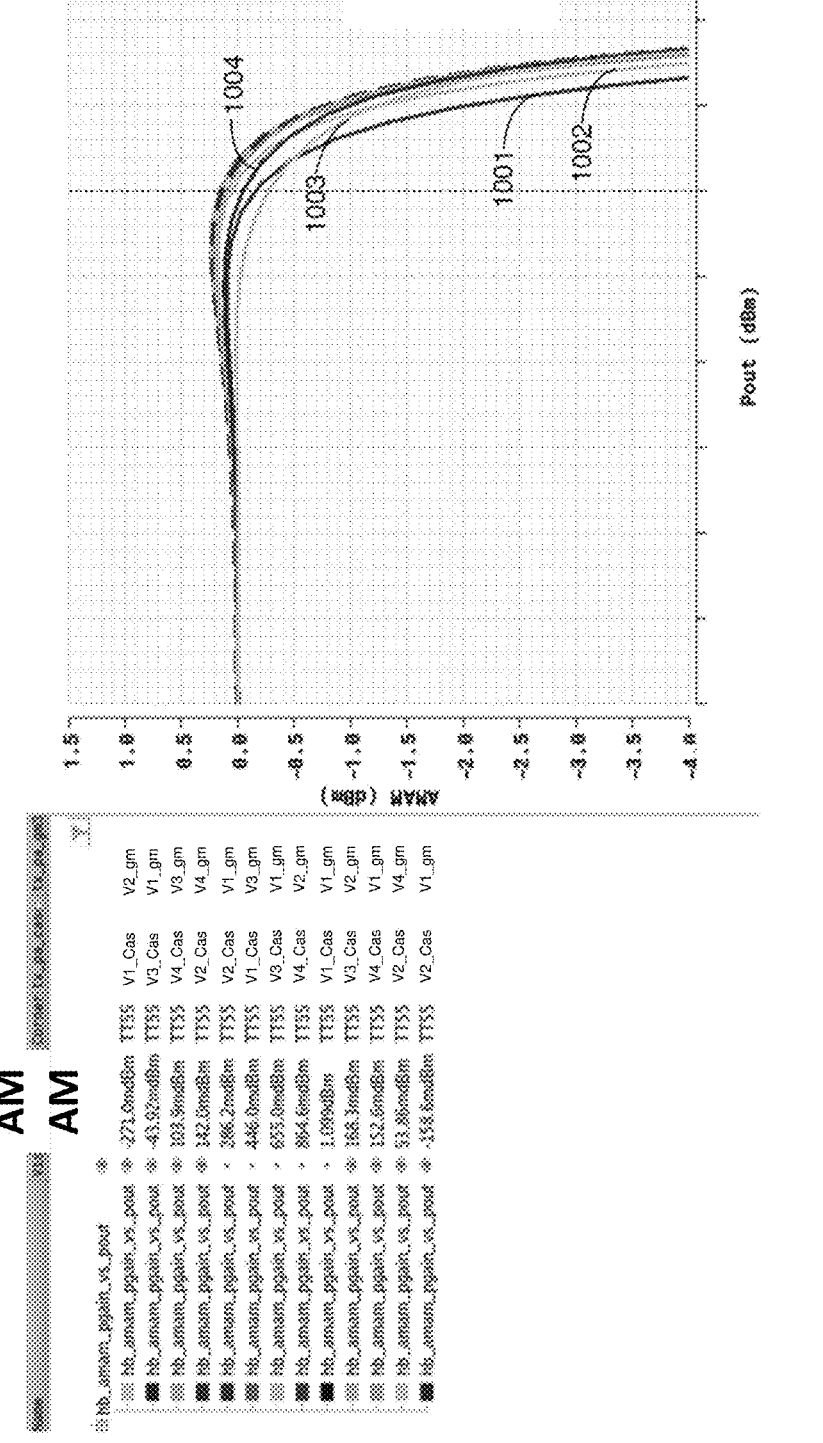
FIG. 10 shows a plurality of AM-AM response plots for one of the signal paths shown in FIG. 3 for one of the PAs having a last stage having the configuration shown in FIG. 4 for an antenna impedance.

FIG. 10 shows a plurality of AM-AM response plots for one of the signal paths shown in FIG. 3 for one of the PAs 304a-304e having a last stage having the configuration shown in FIG. 4 for an antenna impedance. Each AM-AM plot corresponds to a particular set of gm and cascode gate bias values. For this example, four different values of cascode gate biases, V1_Cas-V4_Cas, are used and four different values of gm gate biases, V1_gm-V4_gm, are used. For example, AM-AM plot 1001 corresponds to gm and cascode gate bias values of V2_Cas and V1_gm, respectively. AM-AM plot 1002 corresponds to gm and cascode gate bias values of V2_Cas and V4_gm, respectively. AM-AM plot 1003 corresponds to gm and cascode gate bias values of V1_Cas and V2_gm, respectively. AM-AM plot 1004 corresponds to gm and cascode gate bias values of V3_Cas and V1_gm, respectively. A comparison of the plots 1001-1004 shows that changing the cascode gate bias and/or the gm gate bias results in a change to the shape of the AM_AM plot.

Figure 11:
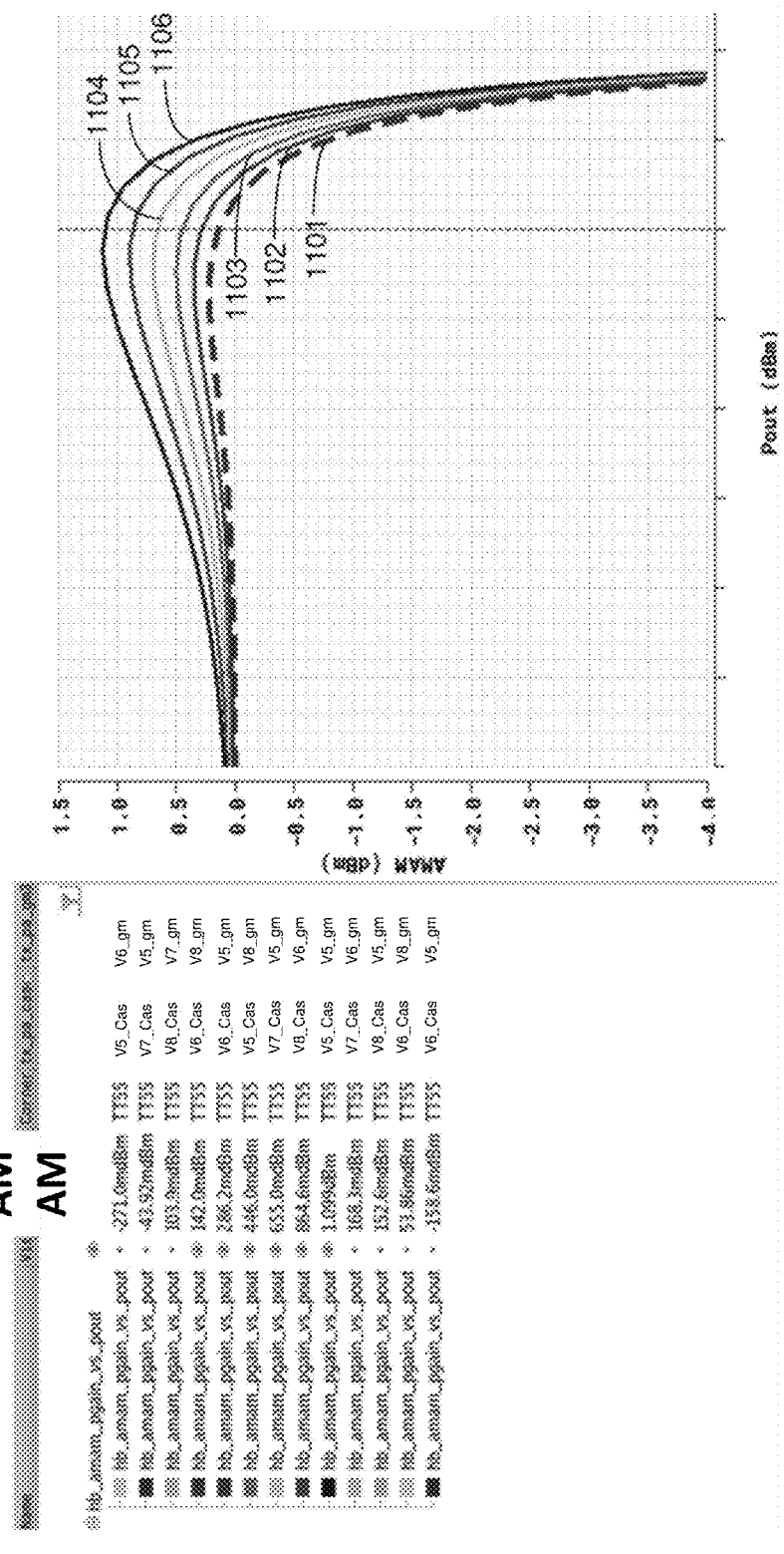
FIG. 11 shows a plurality of AM-AM response plots for one of the signal paths shown in FIG. 3 for one of the PAs having a last stage having the configuration shown in FIG. 4 for an antenna impedance.

FIG. 11 shows a plurality of AM-AM response plots for another of the signal paths shown in FIG. 3 for one of the PAs 304a-304e having a last stage having the configuration shown in FIG. 4 for an antenna impedance. Each AM-AM plot corresponds to a particular set of gm and cascode gate bias values. For this example, four different values of cascode gate biases, V5_Cas-V8_Cas, are used and four different values of gm gate biases, V5_gm-V8_gm, are used. For example, AM-AM plot 1101 is the default AM-AM plot and corresponds to gm and cascode gate bias values of V6_Cas and V8_gm, respectively. AM-AM plot 1102 corresponds to gm and cascode gate bias values of V6_Cas and V5_gm, respectively. AM-AM plot 1103 corresponds to gm and cascode gate bias values of V5_Cas and V8_gm, respectively. AM-AM plot 1104 corresponds to gm and cascode gate bias values of V7_Cas and V5_gm, respectively. AM-AM plot 1105 corresponds to gm and cascode gate bias values of V8_Cas and V6_gm, respectively. AM-AM plot 1106 corresponds to gm and cascode gate bias values of V5_Cas and V5_gm, respectively. It can be seen from a comparison of the plots of FIGS. 10 and 11 that changing the cascode gate bias and/or the gm gate bias values in different ways using different sets of values changes the shape of the AM-AM plot in different ways.

Increasing the gm gate bias can result in a significant current consumption penalty and reducing cascode gate bias results in no current consumption penalty. These factors should be taken into consideration when choosing cascode and gm gate bias values to reshape the AM-AM response plots.

Figure 12:
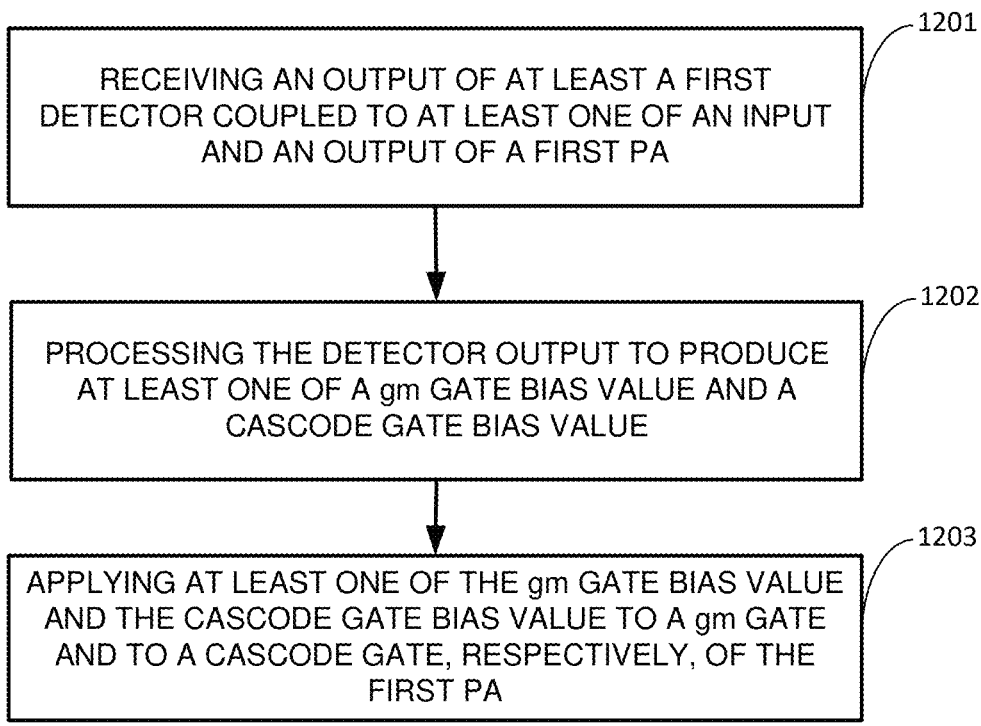
FIG. 12 is a flow diagram that represents the method performed by the antenna tuner shown in FIG. 3 in accordance with an exemplary embodiment.

FIG. 12 is a flow diagram that represents the method performed by the antenna tuner 310 shown in FIG. 3 in accordance with an exemplary embodiment. Block 1201 represents a step of receiving an output of at least a first detector coupled to at least one of an input and an output of a first PA of multiple Pas of a multiple antenna system. Block 1202 represents a step of processing the output of the first detector to produce at least one of a gm gate bias value and a cascode gate bias value. Block 1203 represents a step of applying at least one of the gm gate bias value and the cascode gate bias value to a gm gate and to a cascode gate, respectively, of a stage of the first PA to change an AM-AM response of the first PA.

Figure 13:
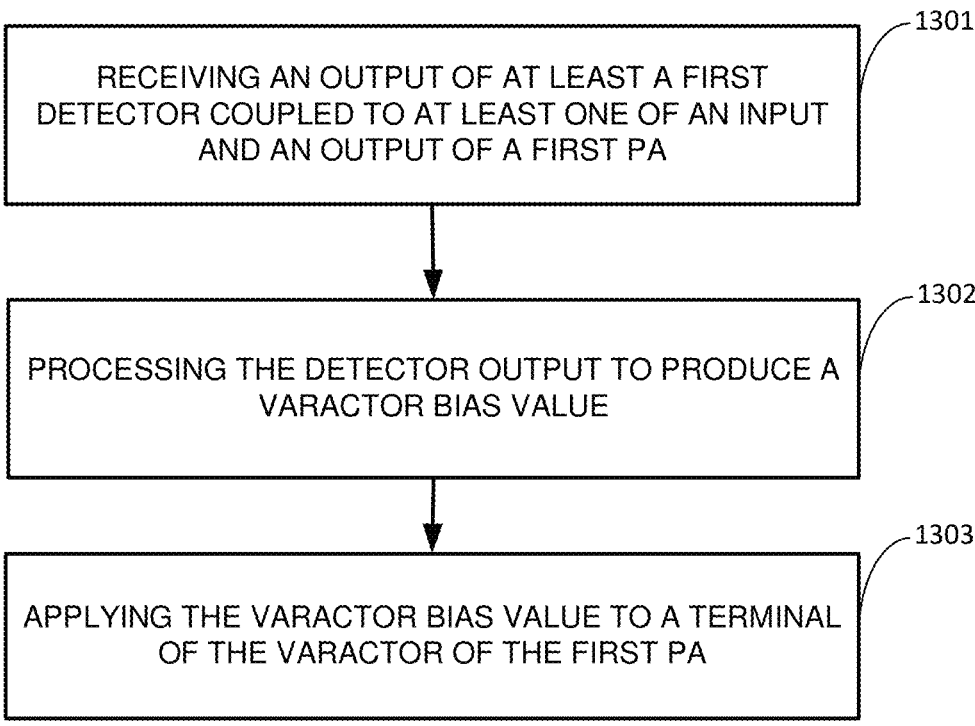
FIG. 13 is a flow diagram that represents the method performed by the antenna tuner shown in FIG. 3 in accordance with another exemplary embodiment.

FIG. 13 is a flow diagram that represents the method performed by the antenna tuner 310 shown in FIG. 3 in accordance with another exemplary embodiment. The method represented by the flow diagram of FIG. 13 can be used in conjunction with the method represented by the flow diagram shown in FIG. 12 or as a separate method. Block 1301 represents a step of receiving an output of at least a first detector coupled to at least one of an input and an output of a first PA of multiple PAs of a multiple antenna system. Block 1302 represents a step of processing the output of the first detector to produce a varactor bias value. Block 1303 represents a step of applying the varactor bias value to a terminal of the varactor of a stage of the first PA to change an AM-PM response of the first PA.

Implementation examples are described in the following numbered clauses:

1. An antenna tuner for use in tuning a multiple antenna system comprising multiple signal paths having multiple respective power amplifier (PAs) coupled to multiple respective antennas, the antenna tuner comprising: a memory device; and a processor in communication with the memory device, the processor being configured to: receive an output of at least a first detector coupled to at least one of an input and an output of a first PA of said multiple PAs, the first PA being located along a first signal path of said multiple signal paths; process the output of said at least a first detector to produce at least one of a gm gate bias value and a cascode gate bias value; and apply at least one of the gm gate bias value and the cascode gate bias value to a gm gate and to a cascode gate, respectively, of a stage of the first PA to change an input amplitude-to-output amplitude (AM-AM) response of the first PA.

2. The antenna tuner of clause 1, wherein said stage of the first PA is a last stage of the first PA, said last stage being coupled to a first antenna of said multiple antennas.

3. The antenna tuner of any of clauses 1-2, wherein processing the output of said at least a first detector to produce at least one of a gm gate bias value and a cascode gate bias value comprises using the output of said at least a first detector to obtain said at least one of the gm gate bias value and the cascode gate bias value from a lookup table (LUT) stored in the memory device.

4. The antenna tuner of clause 3, wherein the LUT includes an index LUT portion and a gate bias value LUT portion, wherein the index LUT portion contains an index value for each of the PAs of the multiple antenna system and wherein the gate bias value portion of the LUT contains gm and cascode gate bias values, and wherein using the output of said at least a first detector to obtain said at least one of the gm gate bias value and the cascode gate bias value from the LUT comprises using the output of said at least a first detector to obtain an index value associated with the first PA from the index LUT portion and then using the associated index value to obtain said at least one of the gm gate bias value and the cascode gate bias value from the gate bias value LUT portion of the LUT.

5. The antenna tuner of clause 4, wherein the gm and cascode gate bias values contained in the gate bias value LUT portion are determined during testing performed in a factory prior to shipment of the multiple antenna system.

6. The antenna tuner of any of clauses 4-5, wherein the index values contained in the index LUT portion of the LUT are determined in the field after the multiple antenna system has been shipped to a customer and after the multiple antenna system has been incorporated into a module or housing.

7. The antenna tuner of any of clauses 4-5, wherein the index values contained in the index LUT portion of the LUT are determined on the fly during runtime operations of the multiple antenna system.

8. The antenna tuner of any of clauses 1-7, wherein the first PA further comprises a varactor, and wherein the processor is further configured to: process the output of said at least a first detector to produce a varactor bias value; and apply the varactor bias value to a terminal of the varactor to change an input amplitude-to-output phase shift (AM-PM) response of the first PA.

9. The antenna tuner of clause 8, wherein the processor processes the output of said at least a first detector to produce the varactor bias value by using the output of said at least a first detector to obtain the varactor bias value from a lookup table (LUT) stored in the memory device.

10. The antenna tuner of clause 9, wherein the LUT includes an index LUT portion and a gate bias value LUT portion, wherein the index LUT portion contains an index value for each of the PAs and wherein the gate bias value portion of the LUT contains gm, cascode and varactor bias values, and wherein using the output of said at least a first detector to obtain the varactor bias value from the LUT comprises using the output of said at least a first detector to obtain the index value associated with the first PA from the index LUT portion and then using the associated index value to obtain the varactor bias value from the gate bias value LUT portion.

11. A method for use in tuning a multiple antenna system comprising multiple signal paths having multiple respective power amplifier (PAs) coupled to multiple respective antennas, the method comprising: in a processor: receiving an output of at least a first detector coupled to at least one of an input and an output of a first PA of said multiple PAs, the first PA being located along a first signal path of said multiple signal paths; processing the output of said at least a first detector to produce at least one of a gm gate bias value and a cascode gate bias value; and applying at least one of the gm gate bias value and the cascode gate bias value to a gm gate and to a cascode gate, respectively, of a stage of the first PA to change an input amplitude-to-output amplitude (AM-AM) response of the first PA.

12. The method of clause 11, wherein said stage of the first PA is a last stage of the first PA, said last stage being coupled to a first antenna of said multiple antennas.

13. The method of any of clauses 11-12, wherein processing the output of said at least a first detector to produce at least one of a gm gate bias value and a cascode gate bias value comprises: using the output of said at least a first detector to obtain said at least one of the gm gate bias value and the cascode gate bias value from a lookup table (LUT) stored in a memory device that is in communication with the processor.

14. The method of clause 13, wherein the LUT includes an index LUT portion and a gate bias value LUT portion, wherein the index LUT portion contains an index value for each of the PAs of the multiple antenna system and wherein the gate bias value portion of the LUT contains gm and cascode gate bias values, and wherein using the output of said at least a first detector to obtain said at least one of the gm gate bias value and the cascode gate bias value from the LUT comprises: using the output of said at least a first detector to obtain an index value associated with the first PA from the index LUT portion and then using the associated index value to obtain said at least one of the gm gate bias value and the cascode gate bias value from the gate bias value LUT portion of the LUT.

15. The method of clause 14, wherein the gm and cascode gate bias values contained in the gate bias value LUT portion are determined during testing performed in a factory prior to shipment of the multiple antenna system.

16. The method of any of clauses 14-15, wherein the index values contained in the index LUT portion of the LUT are determined in the field after the multiple antenna system has been shipped to a customer and after the multiple antenna system has been incorporated into a module or housing.

17. The method of any of clauses 14-15, further comprising: modifying one or more of the index values contained in the index LUT portion of the LUT on the fly during runtime operations of the multiple antenna system.

18. The method of any of clauses 11-17, further comprising: in the processor: process the output of said at least a first detector to produce a varactor bias value; and applying the varactor bias value to a terminal of the varactor to change an input amplitude-to-output phase shift (AM-PM) response of the first PA.

19. A computer program for use in tuning a multiple antenna system comprising multiple signal paths having multiple respective power amplifier (PAs) coupled to multiple respective antennas, the computer program being embodied on a non-transitory computer-readable medium and comprising computer instructions for execution by a processor, the computer instructions comprising: a first portion for receiving an output of at least a first detector coupled to at least one of an input and an output of a first PA of said multiple PAs, the first PA being located along a first signal path of said multiple signal paths; a second portion for processing the output of said at least a first detector to produce at least one of a gm gate bias value and a cascode gate bias value; and a third portion for applying at least one of the gm gate bias value and the cascode gate bias value to a gm gate and to a cascode gate, respectively, of a stage of the first PA to change an input amplitude-to-output amplitude (AM-AM) response of the first PA.

20. The computer program of clause 19, wherein the computer instructions further comprise: a fourth code portion for processing the output of said at least a first detector to produce a varactor bias value; and applying the varactor bias value to a terminal of a varactor of a stage of the first PA to change an input amplitude-to-output phase shift (AM-PM) response of the first PA.

Although selected aspects have been illustrated and described in detail, it will be understood that various substitutions and alterations may be made therein without departing from the spirit and scope of the present invention, as defined by the following claims.

What is claimed is:

1. An antenna tuner for use in tuning a multiple antenna system comprising multiple signal paths having multiple respective power amplifier (PAs) coupled to multiple respective antennas, the antenna tuner comprising:

a memory device; and a processor in communication with the memory device, the processor being configured to:

receive an output of at least a first detector coupled to at least one of an input and an output of a first PA of said multiple PAs, the first PA being located along a first signal path of said multiple signal paths;

process the output of said at least a first detector to produce at least one of a gm gate bias value and a cascode gate bias value; and apply at least one of the gm gate bias value and the cascode gate bias value to a gm gate and to a cascode gate, respectively, of a stage of the first PA to change an input amplitude-to-output amplitude (AM-AM) response of the first PA.

2. The antenna tuner of claim 1, wherein said stage of the first PA is a last stage of the first PA, said last stage being coupled to a first antenna of said multiple antennas.

3. The antenna tuner of claim 2, wherein processing the output of said at least a first detector to produce at least one of a gm gate bias value and a cascode gate bias value comprises using the output of said at least a first detector to obtain said at least one of the gm gate bias value and the cascode gate bias value from a lookup table (LUT) stored in the memory device.

4. The antenna tuner of claim 3, wherein the LUT includes an index LUT portion and a gate bias value LUT portion, wherein the index LUT portion contains an index value for each of the PAs of the multiple antenna system and wherein the gate bias value portion of the LUT contains gm and cascode gate bias values, and wherein using the output of said at least a first detector to obtain said at least one of the gm gate bias value and the cascode gate bias value from the LUT comprises using the output of said at least a first detector to obtain an index value associated with the first PA from the index LUT portion and then using the associated index value to obtain said at least one of the gm gate bias value and the cascode gate bias value from the gate bias value LUT portion of the LUT.

5. The antenna tuner of claim 4, wherein the gm and cascode gate bias values contained in the gate bias value LUT portion are determined during testing performed in a factory prior to shipment of the multiple antenna system.

6. The antenna tuner of claim 5, wherein the index values contained in the index LUT portion of the LUT are determined in the field after the multiple antenna system has been shipped to a customer and after the multiple antenna system has been incorporated into a module or housing.

7. The antenna tuner of claim 5, wherein the index values contained in the index LUT portion of the LUT are determined on the fly during runtime operations of the multiple antenna system.

8. The antenna tuner of claim 1, wherein the first PA further comprises a varactor, and wherein the processor is further configured to:

process the output of said at least a first detector to produce a varactor bias value; and apply the varactor bias value to a terminal of the varactor to change an input amplitude-to-output phase shift (AM-PM) response of the first PA.

9. The antenna tuner of claim 8, wherein the processor processes the output of said at least a first detector to produce the varactor bias value by using the output of said at least a first detector to obtain the varactor bias value from a lookup table (LUT) stored in the memory device.

10. The antenna tuner of claim 9, wherein the LUT includes an index LUT portion and a gate bias value LUT portion, wherein the index LUT portion contains an index value for each of the PAs and wherein the gate bias value portion of the LUT contains gm, cascode and varactor bias values, and wherein using the output of said at least a first detector to obtain the varactor bias value from the LUT comprises using the output of said at least a first detector to obtain the index value associated with the first PA from the index LUT portion and then using the associated index value to obtain the varactor bias value from the gate bias value LUT portion.

11. A method for use in tuning a multiple antenna system comprising multiple signal paths having multiple respective power amplifier (PAs) coupled to multiple respective antennas, the method comprising:

in a processor:

receiving an output of at least a first detector coupled to at least one of an input and an output of a first PA of said multiple PAs, the first PA being located along a first signal path of said multiple signal paths;

processing the output of said at least a first detector to produce at least one of a gm gate bias value and a cascode gate bias value; and applying at least one of the gm gate bias value and the cascode gate bias value to a gm gate and to a cascode gate, respectively, of a stage of the first PA to change an input amplitude-to-output amplitude (AM-AM) response of the first PA.

12. The method of claim 11, wherein said stage of the first PA is a last stage of the first PA, said last stage being coupled to a first antenna of said multiple antennas.

13. The method of claim 12, wherein processing the output of said at least a first detector to produce at least one of a gm gate bias value and a cascode gate bias value comprises:

using the output of said at least a first detector to obtain said at least one of the gm gate bias value and the cascode gate bias value from a lookup table (LUT) stored in a memory device that is in communication with the processor.

14. The method of claim 13, wherein the LUT includes an index LUT portion and a gate bias value LUT portion, wherein the index LUT portion contains an index value for each of the PAs of the multiple antenna system and wherein the gate bias value portion of the LUT contains gm and cascode gate bias values, and wherein using the output of said at least a first detector to obtain said at least one of the gm gate bias value and the cascode gate bias value from the LUT comprises:

using the output of said at least a first detector to obtain an index value associated with the first PA from the index LUT portion and then using the associated index value to obtain said at least one of the gm gate bias value and the cascode gate bias value from the gate bias value LUT portion of the LUT.

15. The method of claim 14, wherein the gm and cascode gate bias values contained in the gate bias value LUT portion are determined during testing performed in a factory prior to shipment of the multiple antenna system.

16. The method of claim 15, wherein the index values contained in the index LUT portion of the LUT are determined in the field after the multiple antenna system has been shipped to a customer and after the multiple antenna system has been incorporated into a module or housing.

17. The method of claim 15, further comprising:

modifying one or more of the index values contained in the index LUT portion of the LUT on the fly during runtime operations of the multiple antenna system.

18. The method of claim 11, further comprising:

in the processor:

process the output of said at least a first detector to produce a varactor bias value; and applying the varactor bias value to a terminal of the varactor to change an input amplitude-to-output phase shift (AM-PM) response of the first PA.

19. A computer program for use in tuning a multiple antenna system comprising multiple signal paths having multiple respective power amplifier (PAs) coupled to multiple respective antennas, the computer program being embodied on a non-transitory computer-readable medium and comprising computer instructions for execution by a processor, the computer instructions comprising:

a first portion for receiving an output of at least a first detector coupled to at least one of an input and an output of a first PA of said multiple PAs, the first PA being located along a first signal path of said multiple signal paths;

a second portion for processing the output of said at least a first detector to produce at least one of a gm gate bias value and a cascode gate bias value; and a third portion for applying at least one of the gm gate bias value and the cascode gate bias value to a gm gate and to a cascode gate, respectively, of a stage of the first PA to change an input amplitude-to-output amplitude (AM-AM) response of the first PA.

20. The computer program of claim 19, wherein the computer instructions further comprise:

a fourth code portion for processing the output of said at least a first detector to produce a varactor bias value; and applying the varactor bias value to a terminal of a varactor of a stage of the first PA to change an input amplitude-to-output phase shift (AM-PM) response of the first PA.

\*   \*   \*   \*   \*